United States Patent
Chen et al.

(10) Patent No.: US 12,550,459 B1
(45) Date of Patent: Feb. 10, 2026

(54) INTEGRATED GERMANIUM PHOTODIODE WITH SELF-ALIGNED IMPLANT AND ELECTRICAL CONTACT

(71) Applicant: Cisco Technology, Inc., San Jose, CA (US)

(72) Inventors: Long Chen, Marlboro, MA (US); Qianfan Xu, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 295 days.

(21) Appl. No.: 18/353,501

(22) Filed: Jul. 17, 2023

Related U.S. Application Data (60) Provisional application No. 63/496,561, filed on Apr. 17, 2023.

(51) Int. Cl.
*H10F 30/223* (2025.01)
*H10F 71/00* (2025.01)

(52) U.S. Cl.
CPC ......... *H10F 30/223* (2025.01); *H10F 71/121* (2025.01)

(58) Field of Classification Search
CPC ... H10F 30/223; H10F 71/121; H01L 31/105; H01L 31/1804
See application file for complete search history.

(56) References Cited

U.S. PATENT DOCUMENTS

| | | | | |
|---|---|---|---|---|
| 6,075,253 A * | 6/2000 | Sugiyama | ............. | H10F 77/147 257/466 |
| 6,136,628 A * | 10/2000 | Sugiyama | ............. | H10F 30/225 438/57 |
| 6,307,242 B1 * | 10/2001 | Sugiyama | ............. | H10F 77/407 257/E31.011 |
| 10,158,036 B2 * | 12/2018 | Usami | ................. | H10F 71/1212 |
| 11,393,939 B2 * | 7/2022 | Chern | ........................ | G01J 1/42 |
| 11,393,940 B2 * | 7/2022 | Chern | ................... | H10F 77/206 |
| 11,404,590 B2 * | 8/2022 | Chern | ................... | H10F 30/223 |
| 11,769,845 B2 * | 9/2023 | Chern | ................. | H10F 77/1465 257/21 |
| 11,769,846 B2 * | 9/2023 | Chern | ................... | H10F 71/121 257/21 |
| 11,824,129 B2 * | 11/2023 | Chern | ................... | H10F 71/121 |
| 11,949,034 B2 * | 4/2024 | Ellis-Monaghan | ........................ | H10F 71/1212 |
| 12,046,689 B2 * | 7/2024 | Chern | ................... | H10F 30/223 |
| 12,154,994 B2 * | 11/2024 | Chern | ................... | H10F 77/122 |

(Continued)

*Primary Examiner* — Earl N Taylor
(74) *Attorney, Agent, or Firm* — Patterson + Sheridan, LLP (57) ABSTRACT

A photodiode device includes a base layer having a first intermediately doped region and a heavily doped region, a dielectric layer disposed over the base layer, a light absorptive material disposed in the dielectric layer, a first electrode, a coating layer, and a second electrode disposed in the dielectric layer and in communication with the heavily doped region. The light absorptive material has a top and a bottom surface, in which the bottom surface is in contact with the first intermediately doped region. The first electrode includes a side surface and a bottom surface. The coating layer includes an inner surface surrounding the side surface of the first electrode, an outer surface in communication with the dielectric layer, and an end surface in communication with the top surface of the light absorptive material, in which the end surface of the coating layer include a second intermediately doped region.

26 Claims, 11 Drawing Sheets

(56) References Cited

U.S. PATENT DOCUMENTS

| | | | | |
|---|---|---|---|---|
| 12,154,996 B2 * | 11/2024 | Chern | ............ | G01J 1/42 |
| 2010/0006961 A1 * | 1/2010 | Yasaitis | ............ | H10F 39/103 |
| | | | | 257/431 |
| 2017/0012143 A1 * | 1/2017 | Usami | ............ | H10F 77/1223 |
| 2017/0317221 A1 * | 11/2017 | Usami | ............ | H10F 30/223 |
| 2021/0320217 A1 * | 10/2021 | Levy | ............ | H10F 77/147 |
| 2023/0420596 A1 * | 12/2023 | Ellis-Monaghan | ............ | |
| | | | | H10F 77/1223 |
| 2024/0072184 A1 * | 2/2024 | Hazbun | ............ | H10F 71/1276 |

\* cited by examiner

INTEGRATED GERMANIUM PHOTODIODE WITH SELF-ALIGNED IMPLANT AND ELECTRICAL CONTACT

CROSS-REFERENCE TO RELATED APPLICATION

The present application is a regular application claiming priority under 35 U.S.C. § 119(e) to U.S. provisional application 63/496,561 entitled INTEGRATED GERMANIUM PHOTODIODE WITH SELF-ALIGNED IMPLANT AND ELECTRICAL CONTACT filed on Apr. 17, 2023, the disclosure of which is hereby incorporated by reference herein in its entirety and for all purposes

FIELD

This disclosure relates generally to the field of integrated photonic systems.

BACKGROUND

Contemporary optical communications and other photonic systems make extensive use of photonic integrated circuits that are advantageously mass-produced in various configurations for various purposes.

SUMMARY

In part, in one aspect, the disclosure relates to various photodiodes and methods of fabrication that increase optical bandwidth without degrading responsivity of the photodiode.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, doped semiconductor structures, elongate semiconductors structures such as wings or caps, passivation coatings/layers, optical paths, waveguides, splitters, couplers, combiners, electro-optical devices, inputs, outputs, ports, channels, components and parts of the foregoing disclosed herein can be used with any laser, laser-based communication system, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

The present disclosure relates to the design, creation, and/or implementation of a photodiode device that may be integrated with optical waveguides in the same die. In various embodiments, the photodiode device may be a PIN photodiode device. In many embodiments, the PIN photodiode device may include a light absorptive material (intrinsic material, I) that is in electrical communication with a p-type semiconductor region (P) at a first surface and in electrical communication with an n-type semiconductor region (N) at a second surface. In an alternative embodiment, the photodiode device may be a NIP photodiode device. which may include a light absorptive material (intrinsic material, I) that is in electrical communication with an n-type semiconductor region (N) at a first surface and is in electrical communication with a p-type semiconductor region (P) at a second surface. In some aspects, the semiconductor may be composed of silicon. In some aspects, the p-type semiconductor region may be fabricated by doping the semiconductor with dopants such as boron or gallium. In some aspects, the n-type semiconductor region may be fabricated by doping the semiconductor with dopants such as phosphorus, antimony, or arsenic. In some embodiments, the light absorptive material may be a doped semiconductor material that is an extrinsic semiconductor material or a doped semiconductor material. In some alternative embodiments, the light absorptive material may be an intrinsic semiconductor material. Non-limiting examples of such light absorptive materials may include germanium, silicon, lead sulphide, gallium arsenide, indium phosphide, indium gallium arsenide, or indium gallium arsenide phosphide. While specific examples disclosed herein may refer to germanium as the light absorptive material, it may be understood that the photodiode device may be composed of such alternative materials, and that process for fabricating the photodiode device may also include such alternative materials.

Functionally, the light absorptive material of a photodiode device may absorb light to generate electrons and hole carriers that can be collected at the p-type semiconductor region and n-type semiconductor region, respectively, to form a photocurrent. The photodiode device may also include electrodes that may include metals such as titanium, tungsten, aluminum, or copper, or highly doped semiconductors. The electrodes may be used to conduct the current generated by the photodiode device to other electrical components.

Photodiode devices may be characterized as having capacitive properties and resistive properties. An amount of photocurrent flowing through a photodiode device may be dependent on both the capacitive and resistive properties of the photodiode device. For example, the PIN structure of a photodiode device may be considered a capacitor, in which the p-type semiconductor region and the n-type semiconductor region may be considered the conducting plates of a capacitor, while the light absorptive material may be considered the capacitor dielectric. Therefore, the width, length, and thickness of the light absorptive material may determine the inherent capacitance of the photodiode device. In particular, light absorptive material having a large width or length, or small thickness may result in a greater capacitance of a photodiode device. Increased capacitance may result in a decrease in photodiode device responsiveness, especially at high frequencies. Increased lengths of conductive paths of the photodiode device, such as the distance between the n-type or p-type semiconductor regions and the electrodes, may increase the electrical resistance of the photodiode device to the photocurrent. Therefore, it is clear that both the inherent capacitance and resistance of a photodiode device should be minimized in order to increase the responsiveness of the device at high frequencies.

Figure 1:
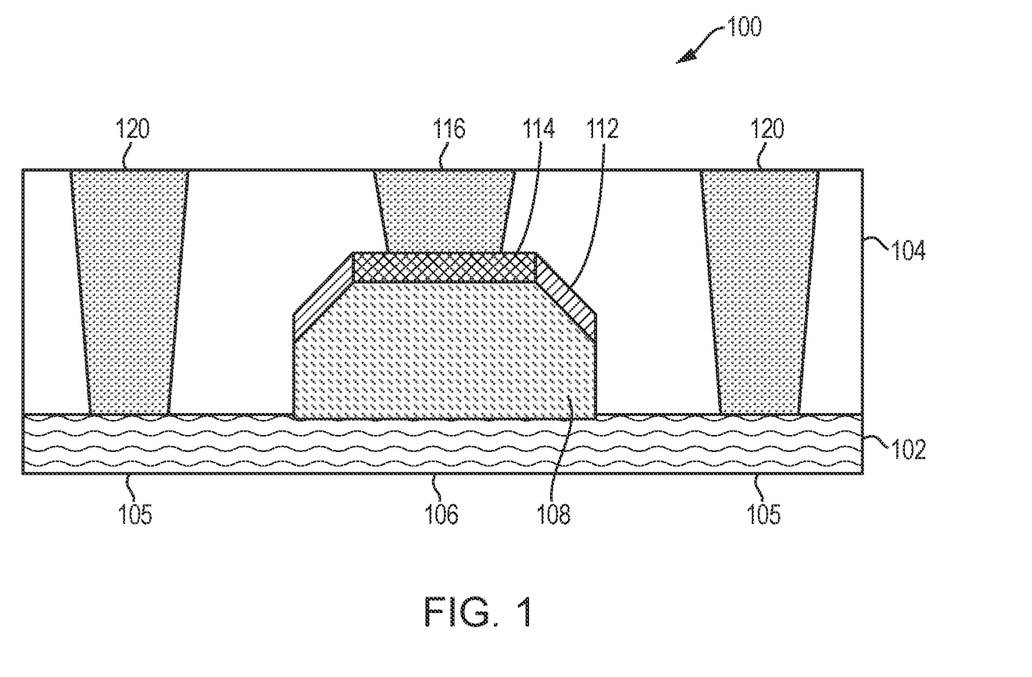
FIG. 1 is a schematic diagram showing a cross-sectional view of an aspect of a PIN photodiode according to an exemplary embodiment of the disclosure.

Referring now to FIG. 1, a cross-sectional view of one aspect of a photodiode device 100 is depicted. The photodiode device is fabricated from a base layer 102, typically silicon, in which a first intermediately doped region 106 and one or more heavily doped regions 105 are implanted. In some aspects, first intermediately doped region 106 may have a dopant concentration of about $1 \times 10^{18}$ atoms/cm$^3$ to about $5 \times 10^{19}$ atoms/cm$^3$. In some aspects, heavily doped region 105 may have a dopant concentration of about $1 \times 10^{20}$ atoms/cm$^3$ to about $5 \times 10^{21}$ atoms/cm$^3$. In some aspects, first intermediately doped region 106 may include a P+ region, and one or more heavily doped regions 105 may include P++ regions. A dielectric layer 104, such as silicon oxide, is deposed over the base layer. A light absorptive material 108 (for example, germanium) is deposited over intermediately doped region 106. Light absorptive material 108 is capped with a thin silicon layer 112. Thin silicon layer 112 may include a second intermediately doped region 114 implanted adjacent to only a top surface of light absorptive material 108. In many cases, light absorptive material 108 has slanted sidewall profiles (i.e., not an ideal rectangle sidewall) based on the nature of epitaxial growth during the fabrication of light absorptive material 108. As a result, the size of second intermediately doped region 114 may be generally smaller (that is, having a smaller profile) than the size of the total upper surface of light absorptive material 108. A first electrode 116 is fabricated to contact second intermediately doped region 114. In many cases, the size of first electrode 116 is the same or smaller than the size of intermediately doped region 114. One or more second electrodes 120 are fabricated to contact each of the one or more heavily doped regions 105.

Light absorptive material 108, thin silicon layer 112 including second intermediately doped region 114, and first electrode 116 are typically fabricated using lithography or photolithography techniques. Such techniques are limited in terms of the sizes of the features they produce, and the accuracy of the placement of overlaying the sequentially fabricated structures. As a result, lithography techniques may only be accurate enough to deposit a light absorptive material 108 having a width greater than or equal to about 1 μm. It may be noted that the size of first electrode 116 may be smaller than the size of second intermediately doped region 114, which again may be smaller than the size of light absorptive material 108. Additionally, for light absorptive material 108 having a width less than about 1 μm, lithography techniques may not be accurate enough for placing first electrode 116 over second intermediately doped region 114 (disposed opposite to the top surface of light absorptive material 108). Thus, alignment of first electrode 116 over second intermediately doped region 114 becomes uncertain for light absorptive material 108 having a width smaller than about 1 μm.

As disclosed above, the capacitance of the light absorptive material is related to its width. Therefore, a photodiode diode device composed of a light absorptive material having a width greater than about 1 μm is limited in its response and signal bandwidth due to its capacitance. It is desirable to have a photodiode device with a signal bandwidth greater than about 100 GHz for modern optical communication purposes. It is anticipated that devices having this greater bandwidth would require light absorptive material having a width of about 0.5 μm or less in order to have reduced capacitance effects. This size is outside the capability of present lithography techniques. The present disclosure describes devices and fabrication processes that can produce photodiode devices composed of a light absorptive material of such smaller sizes. In particular, the processes include methods to assure that the first electrode is self-aligned with the light absorptive material and the second intermediately doped region.

Figure 2:
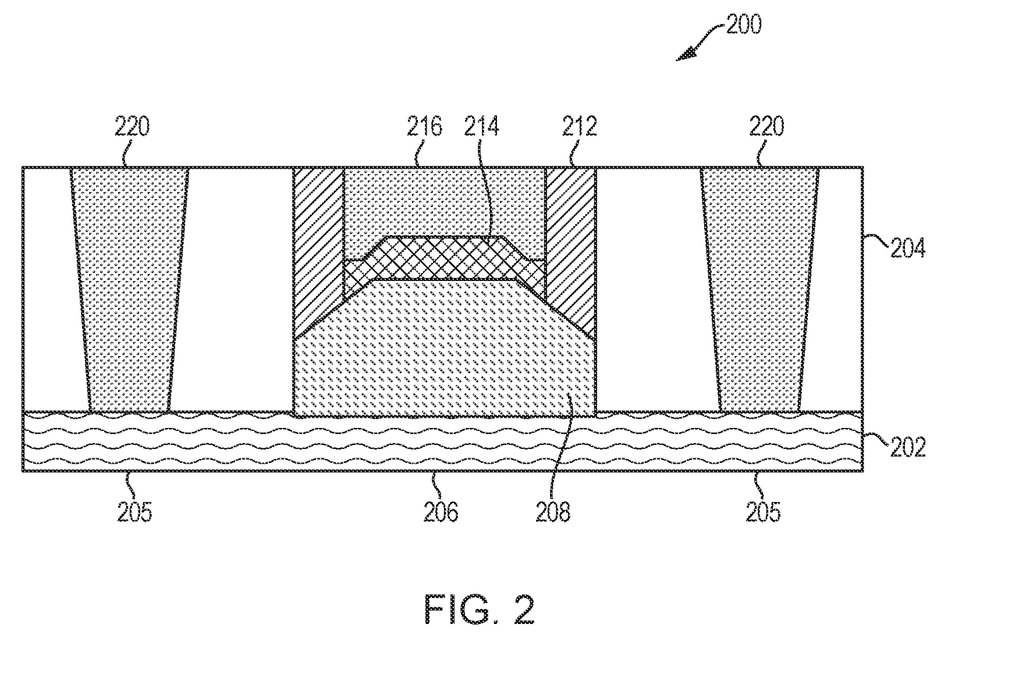
FIG. 2 is a schematic diagram showing a cross-sectional view of another aspect of a PIN photodiode according to an exemplary embodiment of the disclosure.

Referring now to FIG. 2, a cross-sectional view of one aspect of another photodiode device 200 is depicted. Photodiode device 200 is composed of a base layer 202 having a first intermediately doped region 206 and one or more heavily doped regions 205. In some aspects, base layer 202 may be an optically transmissive material, for example silicon. In some aspects, a first intermediately doped region 206 may have a dopant concentration of about $1 \times 10^{18}$ atoms/cm$^3$ to about $5 \times 10^{19}$ atoms/cm$^3$. In some aspects, a heavily doped region 205 may have a dopant concentration of about $1 \times 10^{20}$ atoms/cm$^3$ to about $5 \times 10^{21}$ atoms/cm$^3$. In some aspects, first intermediately doped region 206 may include a P+ region, and one or more heavily doped regions 205 may include P++ regions.

A dielectric layer 204 may be disposed over the base layer. A light absorptive material 208 may be disposed in dielectric layer 204 and in electrical contact with first intermediately doped region 206. In some aspects, light absorptive material 208 may be fabricated from germanium. Photodiode device 200 may also include a photoelectric structure 210 disposed in dielectric layer 204. Photoelectric structure 210 may include a first electrode 216 having a bottom surface. Photoelectric structure 210 may further include a coating layer 212 having an inner surface surrounding and in communication with a side surface of first electrode 216, an outer surface in communication with dielectric layer 204, and an end surface in communication with a top surface of light absorptive material 208. The end surface of coating layer 212 includes a second intermediately doped region 214 in electrical communication with the bottom surface of first electrode 216 and further in electrical communication with the top surface of light absorptive material 208. In some aspects, second intermediately doped region 214 may be composed of an N+ region. In some aspects, the top surface of light absorptive material 208 that is in mechanical communication with the end surface of coating layer 212 may be doped as well. In some aspects, coating layer 212 may be silicon. In this manner, first electrode 216 may be disposed proximate to second intermediately doped region 214 and light absorptive material 208, thereby reducing the resistance of photoelectric structure 210 to photocurrent flow. At the same time, with proper design of the thickness of coating layer 212, light traversing the photodiode device is not substantially reduced by the presence of first electrode 216. Photodiode device 200 may also include one or more second electrodes 220 each disposed within dielectric layer 204 and in electrical communication with one or more heavily doped regions 205.

It may be recognized that first intermediately doped region 206 may include an N+ region, one or more heavily doped regions 205 may include N++ regions, and second intermediately doped region 214 may include a P+ region. Thus, without loss of generality, photodiode device 200 (and similar devices disclosed below and in the following figures) may be a PIN photodiode device or an NIP photodiode device depending on the types of doping used during fabrication.

Referring now to FIGS. 3A-3F, additional embodiments of a photodiode device are depicted in cross-section.

Figure 3A:
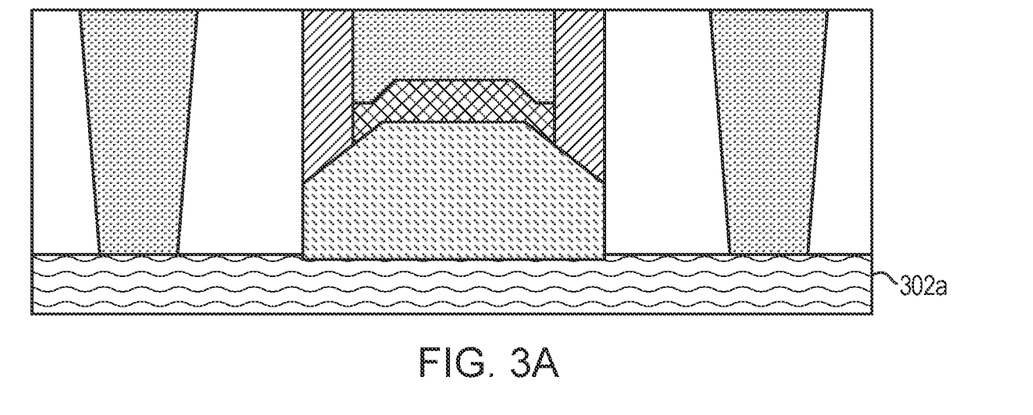
FIGS. 3A-3F are schematic diagrams showing cross-sectional views of several alternative aspects of a PIN photodiode according to exemplary embodiments of the disclosure.

FIG. 3A depicts a device essentially similar to photodiode device 200 depicted in FIG. 2. It is noted that base layer 302a is essentially flat, having a thickness of about 100 nm to about 300 nm.

Figure 3B:
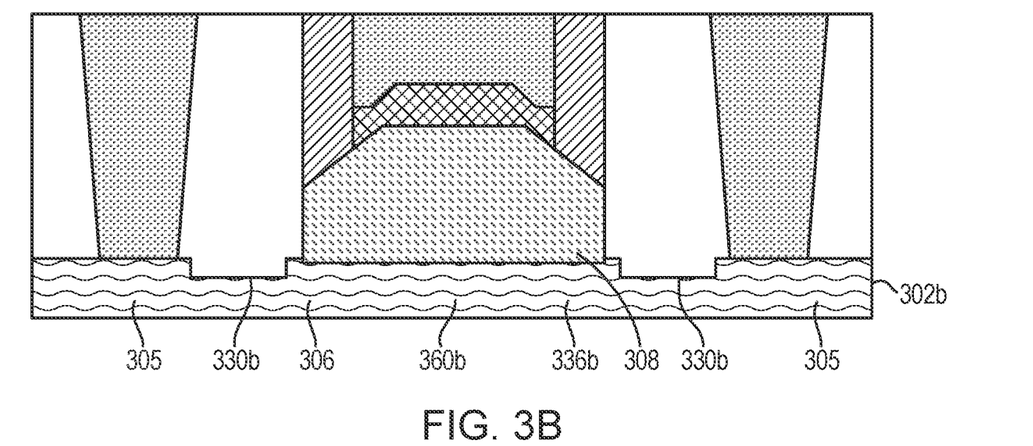

FIG. 3B depicts a device essentially similar to photodiode device 200 depicted in FIG. 2 with one or more etched regions 330b disposed between first intermediately doped region 306 and one or more heavily doped regions 305. Thus, one or more etched regions 330b may be disposed proximate to first intermediately doped region 306. Etched regions 330b may be etched in base layer 302b. Etched regions 330b may have a thickness of about 50 nm to about 250 nm, or about 50 nm to about 300 nm smaller than that of a thickness of base layer 302b. The height difference between etched region 330b and the un-etched region 306 is preferably more than 50 nm. Etched region 330b may result in a raised portion 360b that protrudes above etched region 330b and may comprise at least a portion of first intermediately doped region 306. Raised portion 360b may act as an optical confining region 336b. Optical confining region 336b may act to confine light propagating through base layer 302b to impinge on light absorptive material 308 through its surface in contact with first intermediately doped region 306. In some aspects, optical confining region 336b may be in optical communication with a waveguide disposed in or fabricated from base layer 302b.

Figure 3C:
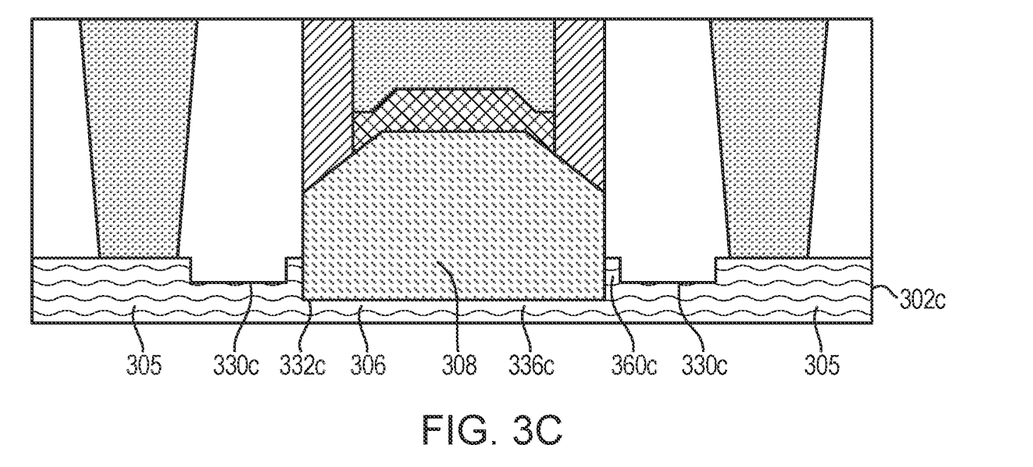

FIG. 3C depicts a device essentially similar to photodiode device 200 depicted in FIG. 2 with one or more etched regions 330c disposed between first intermediately doped region 306 and one or more heavily doped regions 305. Thus, one or more etched regions 330c may be disposed proximate to first intermediately doped region 306. Etched regions 330c may have a thickness of about 50 nm to about 250 nm, or about 50 nm to about 300 nm smaller than that of a thickness of base layer 302c. Etched region 330c may result in a raised portion 360c that protrudes above etched region 330c and that may comprise at least a portion of first intermediately doped region 306. A well 332c may be etched into raised portion 360c. Light absorptive material 308 may be at least partially disposed in well 332c. Well 332c may have a depth of about 50 nm to about 200 nm deep, depending on the thickness of base layer 302c. Raised portion 360c and well 332c together may act as an optical confining region 336c. Optical confining region 336c may act to confine light propagating through base layer 302c to impinge on light absorptive material 308 through its surface in contact with first intermediately doped region 306. In some aspects, optical confining region 336c may be in optical communication with a waveguide disposed in or fabricated from base layer 302c. Etched regions 330c and well 332c may be etched within base layer 302c. In some aspects, etched regions 330c may have a thickness similar to the depth of well 332c. Alternatively, the depth of well 332c may be greater than or less than the thickness of etched regions 330c.

Figure 3D:
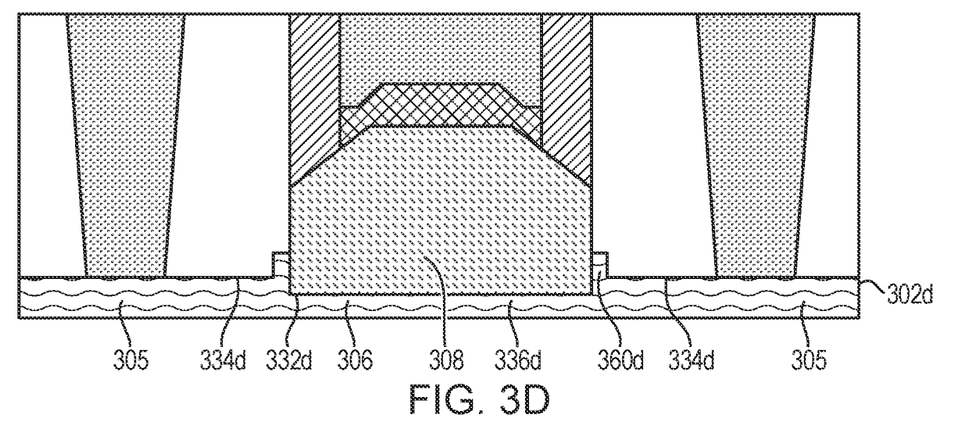

FIG. 3D depicts a device essentially similar to the photodiode device depicted in FIG. 3C. In FIG. 3D, one or more etched regions 334d may extend through one or more heavily doped regions 305. This may be compared to etched regions 330c in FIG. 3C, which extend only up to one or more heavily doped regions 305 without including heavily doped regions 305. Thus, one or more etched regions 334d may be disposed proximate to first intermediately doped region 306. Etched region 334d may result in a raised portion 360d that may protrude above etched region 334d and that may comprise at least a portion of first intermediately doped region 306. A well 332d may be etched into raised portion 360d. Light absorptive material 308 may be at least partially disposed in well 332d. Well 332d may have a depth of about 50 nm to about 250 nm deep, depending on the thickness of base layer 302d. Raised portion 360d and well 332d together may act as an optical confining region 336d. Optical confining region 336d may act to confine light propagating through base layer 302d to impinge on light absorptive material 308 through its surface in contact with first intermediately doped region 306. In some aspects, optical confining region 336d may be in optical communication with a waveguide disposed in or fabricated from base layer 302d. Etched regions 334d may have a thickness similar to that as disclosed above with regard to 330c. The depth of well 332d may be similar to that of well 332c, as disclosed above. Etched regions 334d and well 332d are etched within base layer 302d.

Figure 3E:
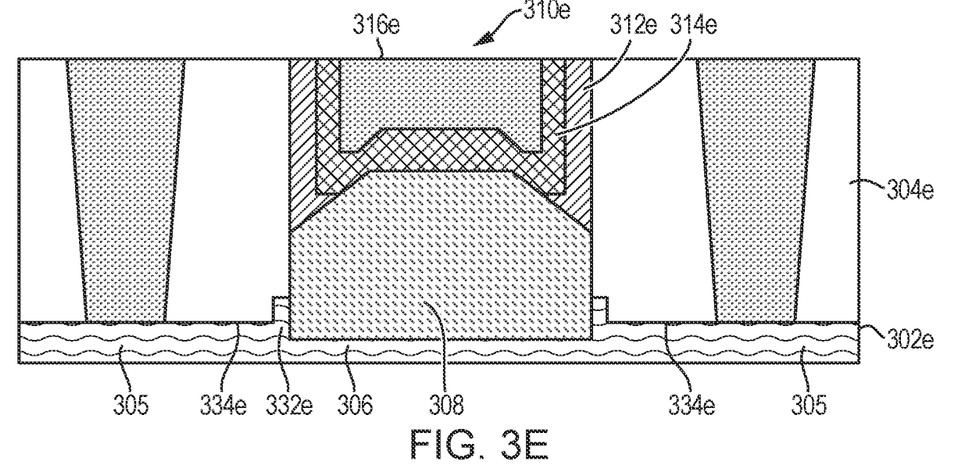

FIG. 3E depicts a device essentially similar to the photodiode device depicted in FIG. 3D. In particular, base layer 302e includes well 332e in which light absorptive material 308 is disposed. Additionally, base layer 302e further includes one or more etched regions 334e that extend through one or more heavily doped regions 305. Thus, one or more etched regions 334e may be disposed proximate to first intermediately doped region 306. Of particular note is photoelectric structure 310e. Photoelectric structure 310e may include a first electrode 316e having a side surface and a bottom surface, and may further include a coating layer 312e. Coating layer 312e may surround the side surface of first electrode 316e, and may include a second intermediately doped region 314e. It may be noted in FIG. 3E, that second intermediately doped region 314e may be in electrical communication with both the side surface of first electrode 316e and the bottom surface of first electrode 316e in addition to a top surface of light absorptive material 308. Coating layer 312e may further include an outer coating surface in communication with dielectric layer 304e and an end surface in communication with a top surface of light absorptive material 308. In this manner, first electrode 316e may be disposed proximate to second intermediately doped region 314e and light absorptive material 308, thereby reducing the resistance of photoelectric structure 310e to photocurrent flow. At the same time, light traversing the photodiode device is not substantially reduced by the presence of first electrode 316e.

Figure 3F:
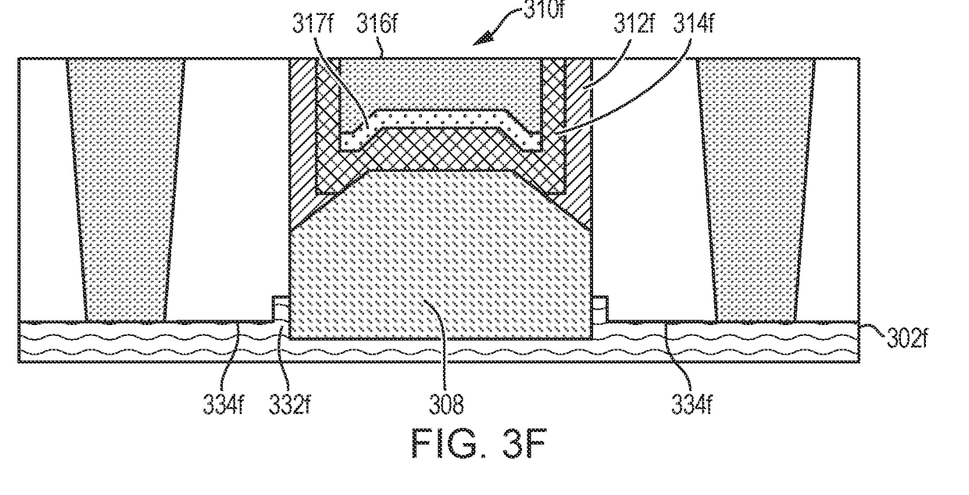

FIG. 3F depicts a device essentially similar to the photodiode device depicted in FIG. 3E. FIG. 3F further depicts dielectric spacer film 317f disposed between the bottom surface of first electrode 316f and a portion of second intermediately doped region 314f disposed at a bottom of coating layer 312f. A portion of second intermediately doped region 314f along an inner side of coating layer 312f may surround a side surface of first electrode 316f. Dielectric spacer 317f may help keep light away from first electrode 316f. In this case, photocurrent flows from the light absorptive material to second intermediately doped region 314f and upward along the portion of second intermediately doped region 314f disposed along the side surface of first electrode 316f. Thus, the photocurrent enters first electrode 316f through its side surface and not directly through the bottom surface of first electrode 316f.

Referring now to FIGS. 4A-4G, an embodiment of a method of fabricating a photodiode device is depicted in cross-sectional views.

Figure 4A:
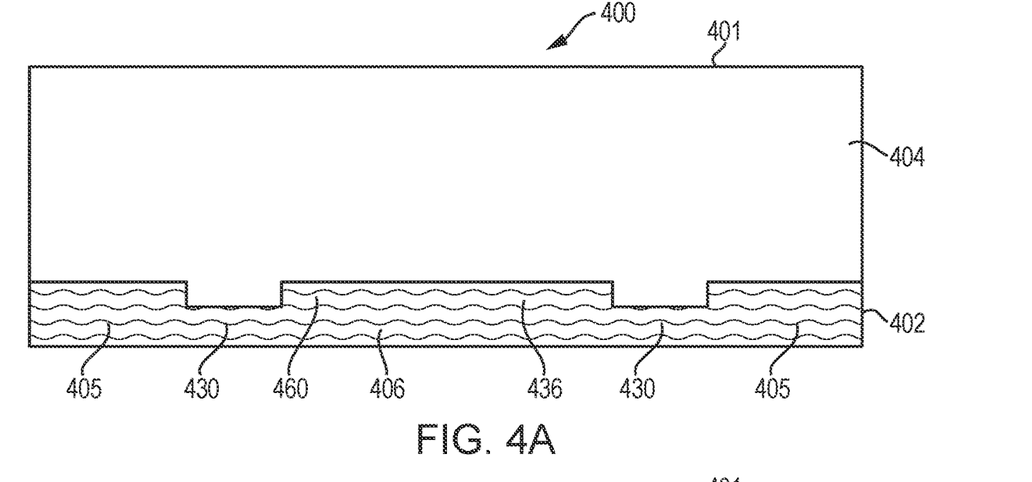
FIGS. 4A-4G are schematic diagrams illustrating a method of fabricating the PIN photodiode depicted in FIG. 2 according to an exemplary embodiment of the disclosure.

Referring now to FIG. 4A, FIG. 4A depicts a wafer 400 having base layer 402, a first intermediately doped region 406 and one or more heavily doped regions 405. In some aspects, base layer 402 may be optically transmissive. In some aspects, base layer 402 is composed of silicon. First intermediately doped region 406 and one or more heavily doped regions 405 may be fabricated using any standard implantation technique as is know in the art, for example by masking a surface of base layer 402 and using ion implantation or gas diffusion. In some aspects, first intermediately doped region 406 may be composed of a P+ dopant disposed in base layer 402. Additionally, one or more heavily doped regions 405 may be composed of a P++ dopant disposed in base layer 402. Base layer 402 may also include etched regions 430 disposed between first intermediately doped region 406 and one or more heavily doped regions 405. Thus, etched region 430 may be disposed proximate to first intermediately doped region 406. Etched regions 430 may result in a raised portion 460 of base layer 402 protruding above etched regions 430. Raised portion 460 may include at least a portion of first intermediately doped region 406. Raised portion 460 may act as an optical confining region 436 to confine light propagating through base layer 402. Wafer 400 may also include dielectric layer 404 disposed on base layer 402. Dielectric layer 404 may be characterized by a dielectric surface 401.

Figure 4B:
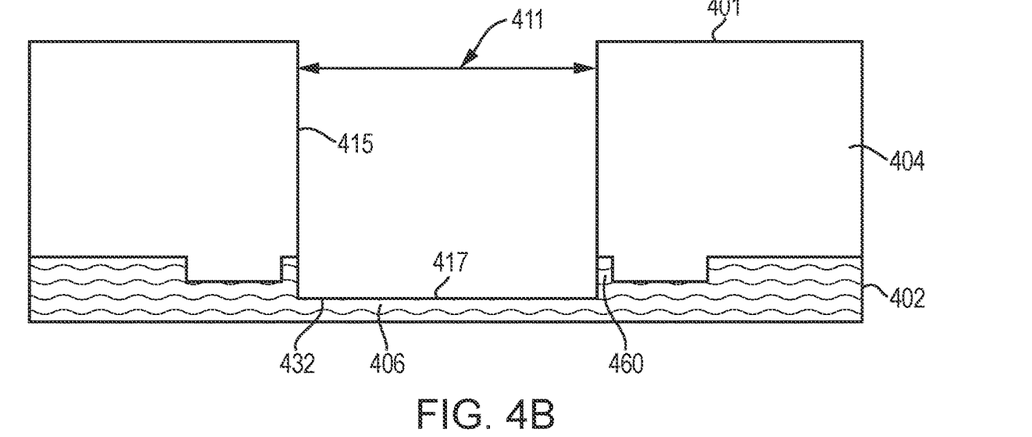

Referring now to FIG. 4B. FIG. 4B depicts the fabrication of a trench 411 through dielectric layer 404 and base layer 402 into first intermediately doped region 406. In this manner a well 432 may be fabricated within first intermediately doped region 406 at raised portion 460. Trench 411 may be characterized by a trench side wall 415 and a trench end 417. In some non-limiting aspects, trench 411 may have a width or diameter of about 300 nm to about 1000 nm. In one aspect, trench 411 may be fabricated using a dry etch process. Here, for simplicity, trench 411 and well 432 are shown in rectangular profile. In some aspects, the sidewalls of trench 411 or of well 432 may be slanted. In some aspects, it may be preferable to have a width of well 432 that is slightly wider than a width of trench 411. The wider width of well 432 may be fabricated by a lateral undercutting method in base layer 402. The lateral undercutting method may preferably result in a width of well 432 being greater by about 10 nm to about 50 nm than the width of trench 411.

Figure 4C:
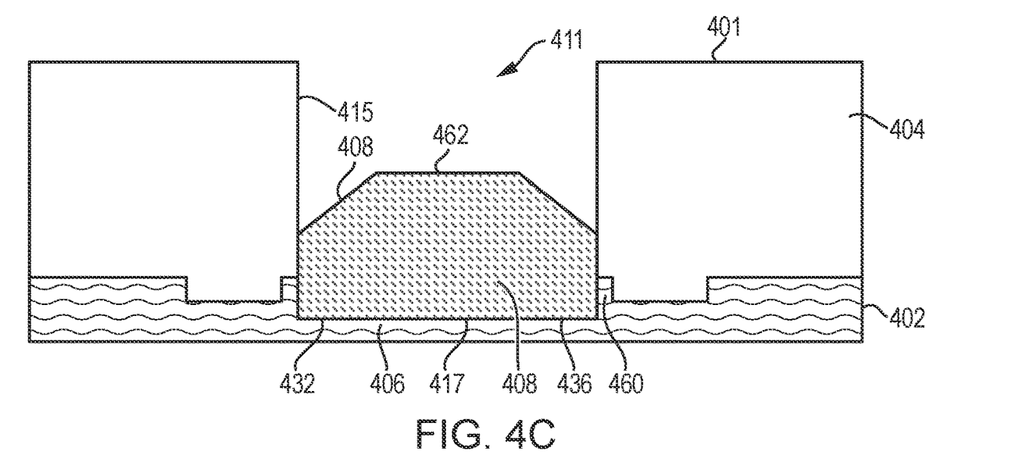

Referring now to FIG. 4C, FIG. 4C depicts a deposition of a light absorptive material 408 in trench 411. Light absorptive material 408 may be deposited in trench end 417 and well 432, in communication with first intermediately doped region 406. Light absorptive material 408 may be deposited within trench 411 and in contact with trench end 417. Therefore, light absorptive material 408 may have a width about equal to the width of trench 411, or about 300 nm to about 1000 nm. Light absorptive material 408 may also extend up at least a portion of trench side wall 415. Light absorptive material 408 may be at least partially disposed within well 432. Raised portion 460 in base layer 402 may act as an optical confining region 436. Optical confining region 436 may act to confine light propagating through base layer 402 to impinge on light absorptive material 408 through its surface in contact with first intermediately doped region 406. In some aspects, optical confining region 436 may be in optical communication with a waveguide disposed in or fabricated from base layer 402.

Light absorptive material 408 may be deposited in trench 411 and well 432 using any known fabrication process, for example a selective epitaxy process. Selective epitaxy may permit the deposition of light absorptive material 408 within trench 411 without coating dielectric surface 401. Light absorptive material 408 may have a width or diameter essentially the same as the width or diameter of trench 411. Light absorptive material 408 may extend up trench side wall 415 to have a height of about 200 nm to about 500 nm. In some aspects, a top surface 462 of light absorptive material 408 may have a shape of a pyramidal or conic frustum due to the nature of crystal epitaxial growth. In some alternative aspects, top surface 462 of light absorptive material 408 may have a domed shape, a flat shape, or any other appropriate shape.

Figure 4D:
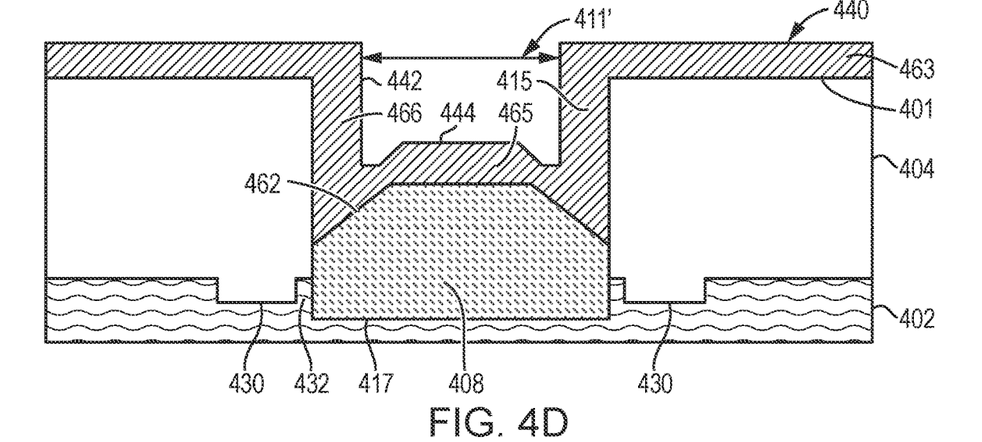

Referring now to FIG. 4D, FIG. 4D depicts a deposition of a coating layer 440. Coating layer 440 may be composed of a dielectric coating layer 463 deposited on dielectric surface 401, a trench wall coating layer 466 deposited along trench side wall 415, and a trench end coating layer 465 deposited on top surface 462 of light absorptive material 408. In some non-limiting aspects, coating layer 440 may be fabricated from silicon. Coating layer 440 may be fabricated according to any known process, for example, non-selective epitaxy. In one aspect, non-selective epitaxy may include chemical vapor deposition of the coating layer material. Coating layer 440 may have a thickness of about 50 nm to about 250 nm. As a result, a reduced trench 411' may be defined by trench wall coating layer 466 and trench end coating layer 465. In one non-limiting example, if coating layer 440 has a thickness of about 100 nm, then reduced trench 411' may have a width or diameter of about 200 nm to about 500 nm. Reduced trench 411' may include a reduced trench sidewall 442 and a reduced trench end 444.

Figure 4E:
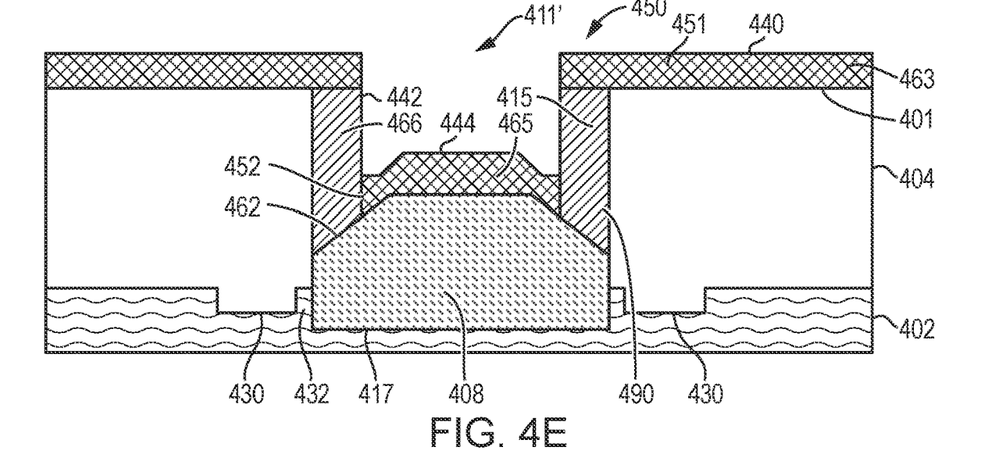

Referring now to FIG. 4E, FIG. 4E depicts ion doping of several portions of coating layer 440 to form a doped coating layer 450. Doped coating layer 450 maybe composed of a surface doped coating region 451 and second intermediately doped region 452. Surface doped coating region 451 may result from ion doping of dielectric coating layer 463. Second intermediately doped region 452 may result from ion doping of trench end coating layer 465. In some aspects, coating layer 440 may be doped using near surface-normal ion implantation techniques. In this manner, trench wall coating layer 466 may not be doped (but see FIG. 7, discussed below). As a result, an un-doped annular region 490 is formed between trench wall coating layer 466 and trench end coating layer 465. Un-doped annular region 490 may be in contact with a top chamfered surface of light absorptive material 408. In some alternative aspects, the doping process may occur simultaneously with the deposition of coating layer 440.

Figure 4F:
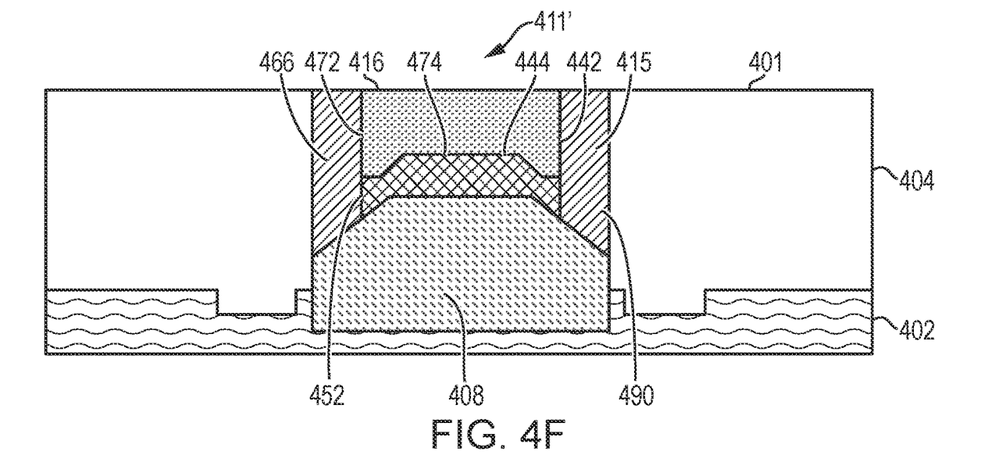

Referring now to FIG. 4F, FIG. 4F depicts the result of additional stages for the fabrication of the photodiode device. In one additional stage, electrode material may be deposited within reduced trench 411' to form a first electrode 416. The electrode material may be deposited within reduced trench 411' using any readily available means such as ion sputtering or evaporation. First electrode 416 may include a side surface 472 and a bottom surface 474. Bottom surface 474 may be in communication with second intermediately doped region 452, thereby forming a first electrical contact. Side surface 472 may be surrounded by and in communication with trench wall coating layer 466 at reduced trench sidewall 442. In some aspects, first electrode 416 may include a stack of different materials, such as titanium/titanium nitride/tungsten. In some aspects, first electrode 416 may be deposited over the entire dielectric coating layer 463 (shown in FIG. 4E), including trench wall coating layer 466. In another stage, a chemical-mechanical planarization step may be used to remove the first electrode materials and dielectric coating layer 463 above dielectric surface 401. One may recognize that the stages disclosed above with respect to FIG. 4F may be carried out in any appropriate order.

Figure 4G:
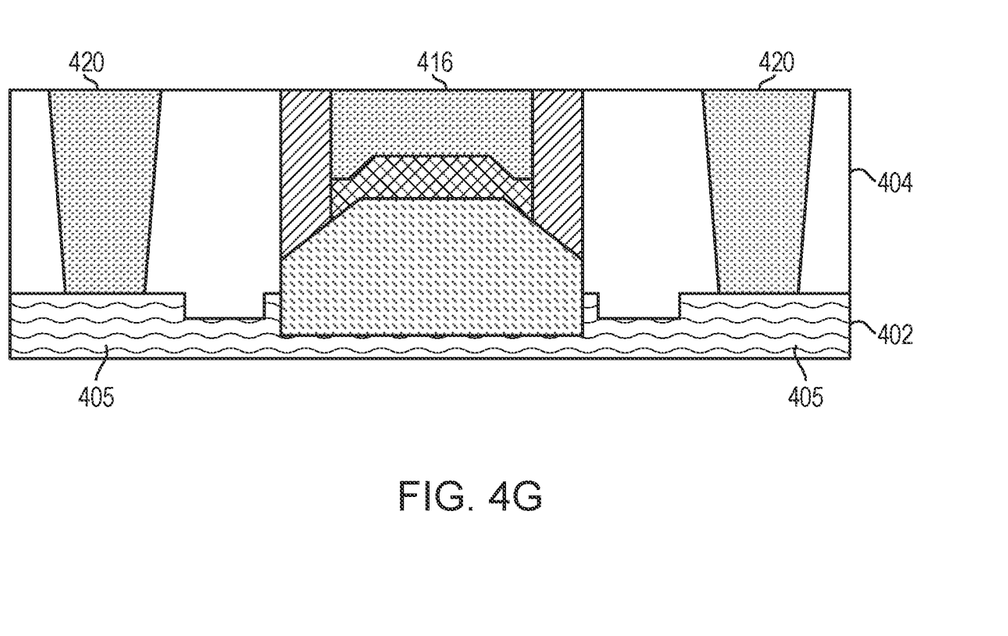

Referring now to FIG. 4G, FIG. 4G depicts the fabrication of second electrodes 420 in the wafer. Second electrodes 420 may be made of any appropriate conducting material. Similar to first electrode 416, in some aspects, second electrode 420 may consist of a stack of different materials, such as titanium/titanium nitride/tungsten. Second electrodes 420 may be fabricated through dielectric layer 404, and may form mechanical and electrical contacts with one or more heavily doped regions 405 deposited in base layer 402. Second electrodes 420 contact one or more heavily doped regions 405 or may be disposed partially into one or more heavily doped regions 405. Second electrodes 420 may be fabricated using any appropriate techniques such as lithography or etching followed by deposition of a second electrode material in the features etched into the wafer. For example, additional trenches may be etched or otherwise fabricated through dielectric layer 404 onto or into heavily doped regions 405. Second electrode material may be deposited into the additional trenches to form second electrodes 420. In some additional aspects, the planarization step discussed above with respect to FIG. 4F may occur after the fabrication of second electrodes 420. In this manner, excess electrode material deposited on dielectric coating layer 463 from the fabrication of first electrode 416 and second electrode 420 may be removed in one step. Alternatively, a second planarization step may follow the fabrication of second electrodes 420.

FIGS. 5A-5B, 6A-6B, 7A-7B, and 8A-8B all depict alternative examples of steps disclosed in the manufacture of a photodiode device as depicted in FIGS. 4A-4G.

Figure 5A:
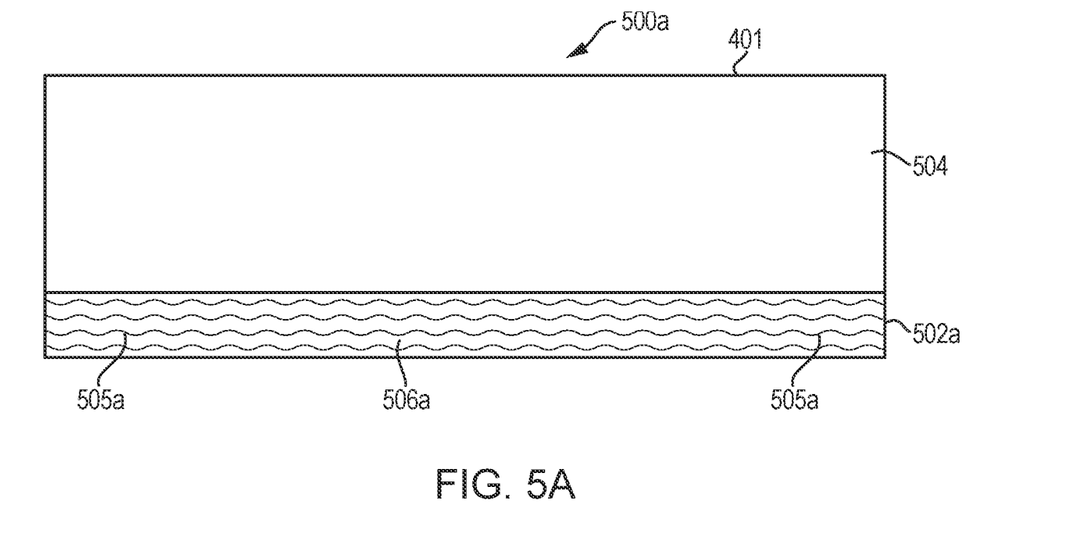
FIGS. 5A-5B depict one set of alternative steps in the method of fabricating a PIN photodiode according to exemplary embodiments of the disclosure.
Figure 5B:
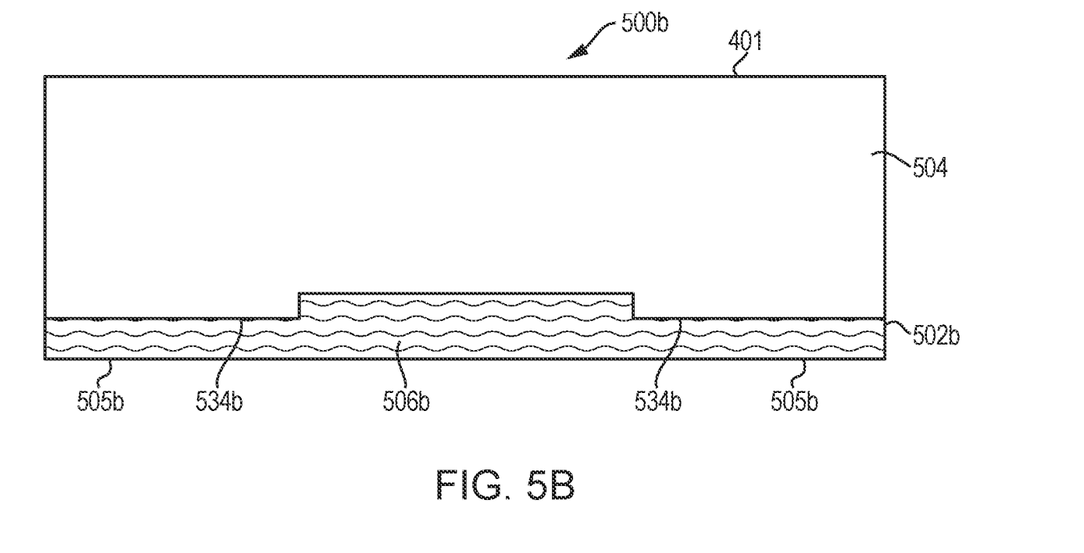

Referring now to FIGS. 5A-5B, alternative structures for wafer 400 depicted in FIG. 4A. In particular, wafer 500a illustrates a wafer that may be used for the fabrication of photodiode device depicted in FIG. 3A. In this aspect, base layer 502a is essentially flat. It may be seen that base layer 502a also includes first intermediately doped region 506a and one or more heavily doped regions 505a. In FIG. 5B, wafer 500b illustrates a wafer that may be used for the fabrication of photodiode devices depicted in FIGS. 3D-3F. In this aspect, one or more etched regions 534b may extend through one or more heavily doped regions 505b in base layer 502b. Thus, etched regions 534b may be proximate to first intermediately doped region 506b.

Figure 6A:
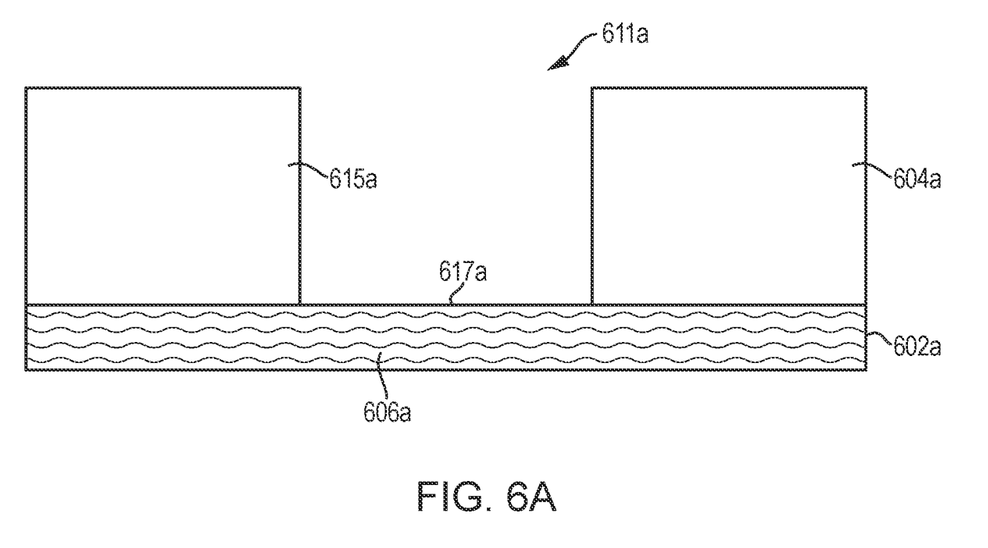
FIGS. 6A-6B depict a second set of alternative steps in the method of fabricating a PIN photodiode according to exemplary embodiments of the disclosure.
Figure 6B:
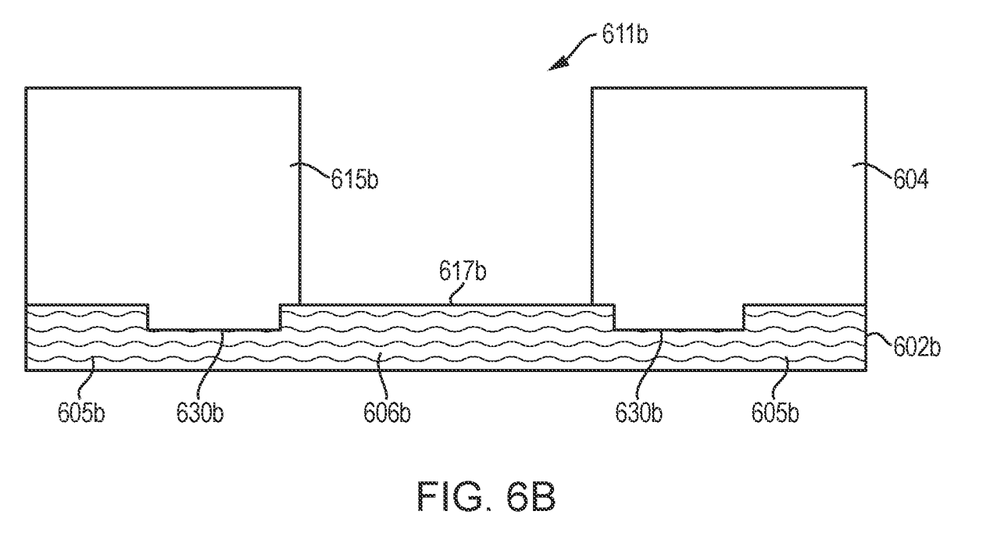
Figure 7A:
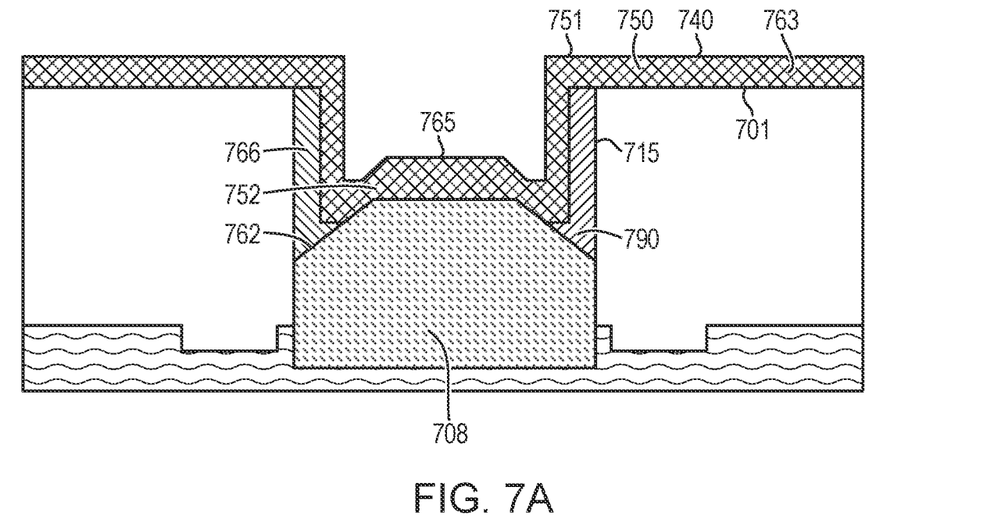
FIGS. 7A-7B depict a third set of alternative steps in the method of fabricating a PIN photodiode according to exemplary embodiments of the disclosure.
Figure 7B:
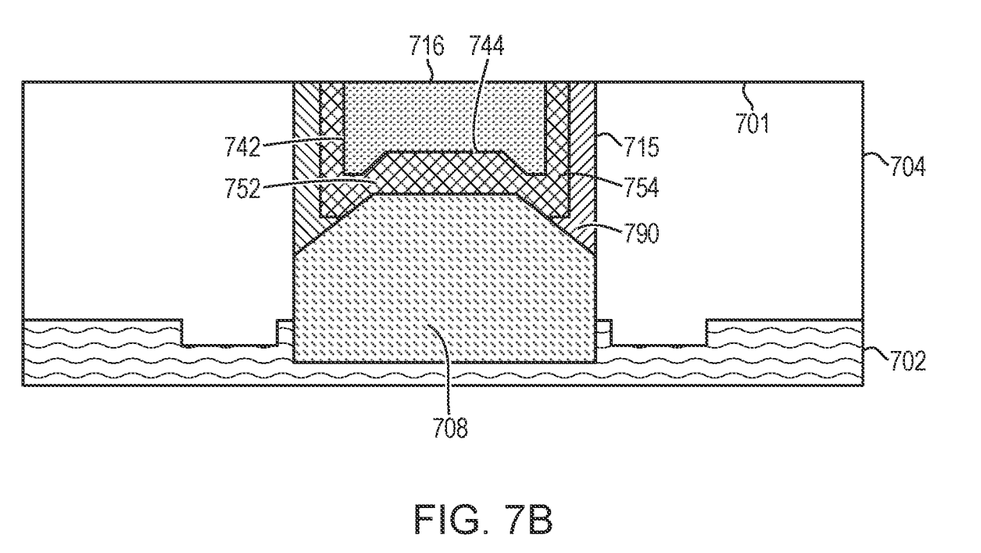

Referring now to FIGS. 6A-6B, alternative structures for the fabrication of trench 411 as depicted in FIG. 4B. In particular, wafer FIG. 6A illustrates a trench 611a that may be used for the fabrication of photodiode device depicted in FIG. 3A. Trench 611a may be fabricated through dielectric layer 604a to a surface of base layer 602a forming a contact with a surface of first intermediately doped region 606a disposed in base layer 602a. Trench 611a may be characterized by a trench side wall 615a and a trench end 617a. FIG. 6B illustrates a trench 611b that may be used for the fabrication of photodiode devices depicted in FIG. 3B. Base layer 602b may include one or more etched regions 630b disposed between first intermediately doped region 606b and one or more heavily doped regions 605b. Thus, etched regions 630b may be proximate to first intermediately doped region 606b. Trench 611b may be fabricated through dielectric layer 604b to a surface of base layer 602b forming a contact with a surface of first intermediately doped region 606b. Trench 611a may be characterized by a trench side wall 615b and a trench end 617b Referring now to FIG. 7A, FIG. 7A depicts an alternative ion doping step as depicted in FIG. 4E. In particular, FIG. 7A depicts ion doping of coating layer 740 to form a doped coating layer 750. Coating layer 740 may be composed of a dielectric coating layer 763 deposited on dielectric surface 701, a trench wall coating layer 766 deposited along trench side wall 715, and a trench end coating layer 765 deposited on top surface 762 of light absorptive material 708. FIGS. 7A-7B illustrate alternative ion doping steps that may be used for the fabrication of photodiode devices depicted in FIGS. 3E and 3F. Doped coating layer 750 maybe composed of a surface doped coating region 751 and a second intermediately doped region 752. Surface doped coating region 751 may result from ion doping of dielectric coating layer 763. Second intermediately doped region 752 may result from ion doping of trench end coating layer 765. The doped region of trench end coating layer 765 needs to extend the full thickness of the dielectric layer to achieve electrical communication with light absorptive material 708. In some aspects, the doped region of trench wall coating layer 766 may extend the full wall thickness. In some other aspects, a portion of an inner surface of trench wall coating layer 766 may be doped. In some aspects, coating layer 740 may be doped using a combination of normal angle and tilted angle ion implantation techniques, or ion diffusion techniques, thereby resulting in the doping of trench side wall 715 in addition to the flat surfaces dielectric coating layer 763 and a trench end coating layer 765.

Referring now to FIG. 7B, FIG. 7B depicts the results of additional stages for the fabrication of the photodiode device as depicted in FIG. 4F starting with the aspect depicted in FIG. 7A.

Figure 8A:
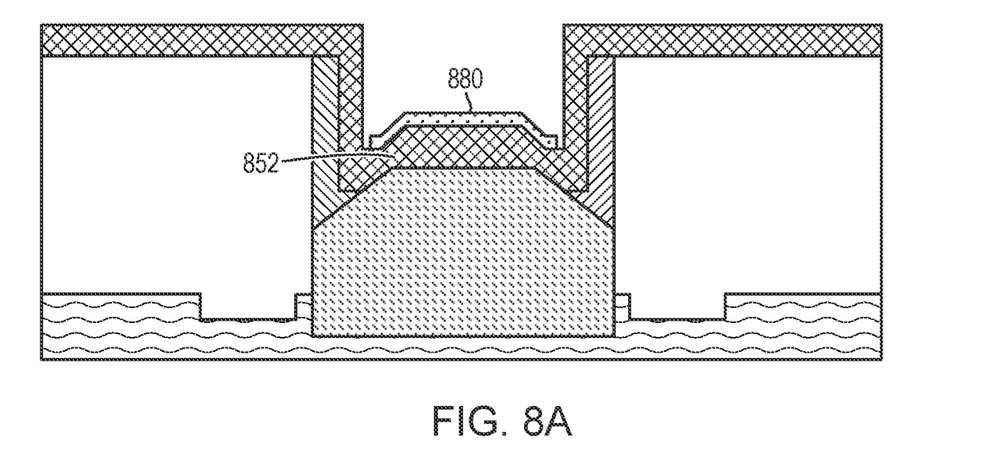
FIGS. 8A-8B depict a fourth set of alternative steps in the method of fabricating a PIN photodiode according to exemplary embodiments of the disclosure.
Figure 8B:
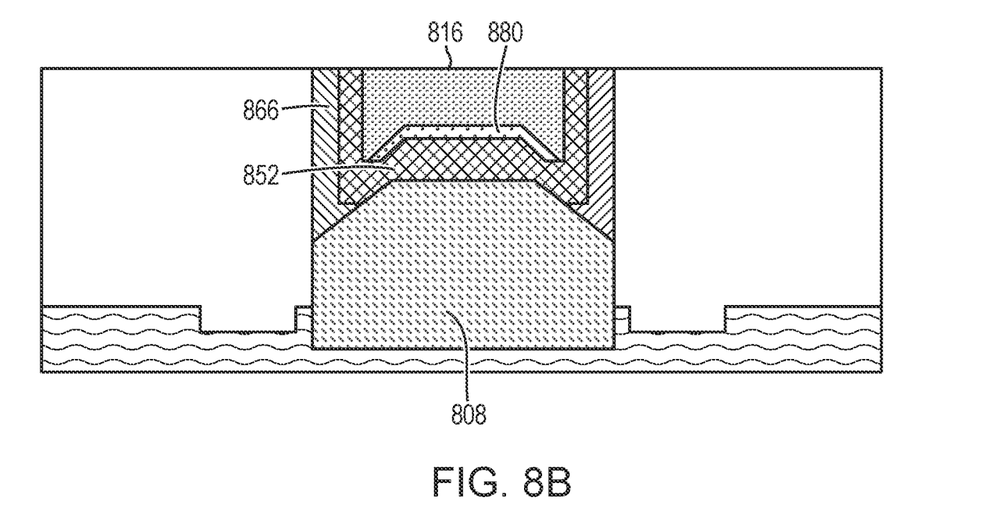

Referring now to FIG. 8A, FIG. 8A depicts an additional fabrication step that may be employed after the step depicted in FIG. 7A. In particular, FIG. 8A depicts the deposition of a dielectric spacer film 880 over a top surface of second intermediately doped region 852. FIGS. 8A-8B illustrate additional fabrication steps that may be used for the fabrication of photodiode devices depicted in FIG. 3F. Dielectric spacer film 880 may be composed of additional light transmissive materials, such as polysilicon, silicon dioxide, or silicon nitride. Dielectric spacer film 880 may be deposited on a top surface of second intermediately doped region 852.

In some aspects, dielectric spacer film 880 may have a thickness of about 20 nm to about 100 nm.

Referring now to FIG. 8B, FIG. 8B depicts the results of additional stages for the fabrication of the photodiode device as depicted in FIG. 4F. It may be observed that a side surface of first electrode 816 is in electrical contact with the doped portion of trench wall coating layer 866. In this aspect, a bottom surface of first electrode 816 is in communication with dielectric spacer film 880. As a result, current flow to first electrode 816 may be inhibited through the bottom surface of first electrode 816. Electrical current may still flow from light absorptive material 808 through second intermediately doped region 852, the doped portion of trench wall coating layer 866 to the side surface of first electrode 816.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

The invention claimed is:

1. A photodiode device comprising:
    a base layer having a first intermediately doped region and a heavily doped region;
    a dielectric layer disposed over the base layer;
    a light absorptive material, having a top surface and a bottom surface, disposed in the dielectric layer, wherein the bottom surface is in contact with the first intermediately doped region;
    a first electrode comprising a side surface and a bottom surface;
    a coating layer comprising:
        an inner surface surrounding and in electrical communication with the side surface of the first electrode;
        an outer surface in mechanical communication with the dielectric layer; and
        an end surface in electrical communication with the top surface of the light absorptive material,
        wherein the end surface of the coating layer comprises a second intermediately doped region; and
    a second electrode disposed in the dielectric layer and in electrical communication with the heavily doped region of the base layer.

2. The photodiode device of claim 1, wherein the bottom surface of the first electrode is in electrical communication with the second intermediately doped region of the coating layer.

3. The photodiode device of claim 1, wherein the coating layer comprises silicon.

4. The photodiode device of claim 1, wherein the first intermediately doped region, the light absorptive material, and the second intermediately doped region form a PIN or NIP photodiode.

5. The photodiode device of claim 1, further comprising a raised portion comprising at least a portion of the first intermediately doped region, which protrudes above an etched region of the base layer to form an optical confinement region.

6. The photodiode device of claim 5, wherein the optical confinement region is in optical communication with a waveguide disposed in or fabricated from the base layer.

7. The photodiode device of claim 1, wherein the base layer comprises silicon.

8. The photodiode device of claim 1, wherein the base layer comprises a well disposed in the first intermediately doped region, and
wherein a portion of the light absorptive material is disposed within the well.

9. The photodiode device of claim 8, wherein a thickness of the base layer is 100 nm to 300 nm, and a depth of the well is 50 nm to 250 nm.

10. The photodiode device of claim 1, wherein the light absorptive material comprises germanium.

11. The photodiode device of claim 1, wherein a width of the light absorptive material is 300 nm to 1000 nm.

12. The photodiode device of claim 1, wherein a thickness of the light absorptive material is 200 nm to 500 nm.

13. The photodiode device of claim 1, wherein a thickness of the coating layer is 50 nm to 250 nm.

14. The photodiode device of claim 1, wherein the second intermediately doped region further comprises a portion of the inner surface of the coating layer.

15. The photodiode device of claim 14, wherein the second the intermediately doped region surrounds and is in electrical communication with the side surface of the first electrode.

16. The photodiode device of claim 15, further comprising a dielectric spacer between the bottom surface of the first electrode and the end surface of the coating layer.

17. The photodiode device of claim 16, wherein the dielectric spacer comprises silicon dioxide or silicon nitride.

18. The photodiode device of claim 16, wherein a thickness of the dielectric spacer is 20 nm to 100 nm.

19. A method of fabricating a photodiode device, comprising:
providing a wafer comprising a base layer having a first intermediately doped region and a heavily doped region, and a dielectric layer disposed thereon;
fabricating a trench through the dielectric layer to the first intermediately doped region of the base layer;
depositing a light absorptive material in the trench on the first intermediately doped region;
depositing a coating layer on the dielectric layer, on a top surface of the light absorptive material, and along a side wall of the trench, thereby forming a reduced trench;
doping the coating layer to form a second intermediately doped region;
depositing an electrode material within the reduced trench in electrical communication with the second intermediately doped region, thereby forming a first electrode; and
planarizing the dielectric layer.

20. The method of claim 19, wherein doping the coating layer comprises doping a portion of the coating layer on the dielectric layer and doping an end portion of the coating layer deposited on the top surface of the light absorptive material.

21. The method of claim 19, wherein doping the coating layer comprises doping a portion of the coating layer on the dielectric layer, doping the coating layer along the side wall of the trench, and doping an end portion of the coating layer deposited on the top surface of the light absorptive material.

22. The method of claim 19, wherein depositing the coating layer and doping the coating layer occur simultaneously.

23. The method of claim 19, wherein fabricating the trench comprises fabricating the trench through the dielectric layer and through a portion of the first intermediately doped region of the base layer.

24. The method of claim 19, further comprising:
fabricating a second trench through the dielectric layer to the heavily doped region of the base layer; and
depositing a second electrode material within the second trench in electrical communication with the heavily doped region.

25. The method of claim 19, wherein the base layer comprises an etched region proximate to the first intermediately doped region.

26. The method of claim 19, further comprising fabricating a dielectric spacer film disposed between the first electrode and the coating layer on the top surface of the light absorptive material.

\* \* \* \* \*